United States Patent [19]

Beck et al.

[11] 4,138,643

[45] Feb. 6, 1979

[54] PROGRAMMABLE PROBE FIXTURE AND METHOD OF CONNECTING UNITS UNDER TEST WITH TEST EQUIPMENT

[75] Inventors: Robert L. Beck, Wheeling; Peter H. Goebel, Barrington, both of Ill.

[73] Assignee: Motorola, Inc., Schaumburg, Ill.

[21] Appl. No.: 758,212

[22] Filed: Jan. 10, 1977

Related U.S. Application Data

[63] Continuation of Ser. No. 554,859, Mar. 3, 1975, abandoned.

[51] Int. Cl.² .................... G01R 31/02; G01R 1/06; G01R 15/12
[52] U.S. Cl. .............................. 324/158 F; 324/72.5; 324/73 PC; 324/158 P
[58] Field of Search ............ 324/158 F, 158 P, 158 R, 324/72.5, 73 AT, 73 PC; 92/166

[56] References Cited

U.S. PATENT DOCUMENTS

| | | | |
|---|---|---|---|
| 198,391 | 12/1877 | Jamieson | 92/166 |
| 3,714,572 | 1/1973 | Ham et al. | 324/158 F |

OTHER PUBLICATIONS

Till, A. W., "Pneumatic Contact Probe", IBM Tech. Dis. Bull., vol. 13, No. 6, Nov. 1970, p. 1551.

*Primary Examiner*—Rudolph V. Rolinec
*Assistant Examiner*—Ernest F. Karlsen
*Attorney, Agent, or Firm*—James W. Gillman; Donald J. Lisa; Phillip H. Melamed

[57] ABSTRACT

A support houses a plurality of probes for guided movement relative to a printed circuit board unit under test fixedly mounted adjacent the support. Each probe is operatively associated with independent, pneumatically operated, piston and cylinder drive means for moving individual probes selected according to a predetermined program from a first retracted position to a second extended position. In the extended position only a continuous conductive path through the piston and cylinder is formed between the unit under test and an electrical interface for transmitting electronic signals therebetween. Several varieties of probes are provided for low and high frequency applications.

41 Claims, 11 Drawing Figures

PROGRAMMABLE PROBE FIXTURE AND METHOD OF CONNECTING UNITS UNDER TEST WITH TEST EQUIPMENT

This is a continuation, of application Ser. No. 554,859, filed Mar. 3, 1975, now abandoned.

BACKGROUND

1. Field of the Invention

This invention relates to probe fixtures used in connecting circuit boards or circuit panels to manual or automatic test equipment, and specifically to a single programmable probe which may be used to perform both functional and diagnostic testing, either static or dynamic. The invention further relates to a system of test equipment employing a plurality of probes in a fixture each probe being independently programmable, the method of interconnecting the unit under test to the stimulus and measurement equipment, and the program control therefor.

2. Prior Art

Test equipment, including probe fixtures, is available for performing functional and diagnostic testing of circuit boards and panels. Such equipment can perform both static and dynamic tests.

In order to perform such tests it is necessary to bring one or more probes into electrical contact with one or more terminals of the circuit board. Then, for example, by selectively applying electrical signals to one or more of the contacted terminals through the probes and by reading or analyzing the signal characteristics at other contacted terminals through the probes it is possible to functionally and diagnostically test the circuits on the board or panel.

A static test is one in which just DC signals are applied through the probes to the board and the DC performance characteristics of various circuit components are measured. In dynamic testing, AC signals are selectively applied as inputs and the AC characteristics of the various circuit components under test are measured. Functional testing is the testing of a circuit under its designed conditions. Diagnostic testing, as the name implies, is the process of fault isolation in a given circuit.

A dynamic functional test, then, is one in which AC inputs are applied through one or more probes to selected terminals and the AC outputs at other selected terminals are measured through the probes, without using any other extraneous probes, to determine if the outputs meet designed specifications. As known in the prior art, when high frequency signals were used in such tests, it was required to use a probe fixture having a minimum number of probes placed adjacent the test panel in order to avoid external loading and detuning of the circuit under test. This detuning problem was caused by the frequency characteristics of the probes themselves which resulted in parasitic inductances or capacitances in the tested circuit thereby altering its designed electrical characteristics. Faulty tests resulted.

Dynamic diagnostic testing, then, is the process of isolating a faulty circuit in an electronic module by tracing the AC signal sequentially from the input of one circuit to the output thereof and then to the input of the next circuit in line and then to its output, etc. until the faulty circuit is located. Such testing requires not only the probes contacting the initial input and final output terminals, as in functional testing, but also, the probes for contacting the various input and output terminals of the intermediate circuit components as well. Thus, a plurality of probes are required. In the prior art, since single independently programmable probes were not known until applicants' invention thereof, and due to the requirement to limit the number of probes which contacted the panels in order to avoid detuning of the circuit being dynamically tested, as aforesaid, the testing procedure required moving the test panel from the one probe fixture used for functional testing to another, or several other, probe fixtures for the diagnostic testing. Alternatively, it was known to mount the probes needed for each type of test to movable supports, vertically stack the supports one upon the other with the probes of the lower levels being received through holes in the upper level supports and then selectively reciprocate the levels of probes required by the particular test. Thus, the testing procedure was very laborious, time consuming and expensive in that numerous different or complex probe fixtures and test equipment were required.

The problem of detuning printed circuit boards is especially evident in the testing of analog and high speed logic modules which operate at high frequencies in the megahertz range. An example of such an analog module is the front end of an FM tuner. In such analog modules, operating voltages are maintained at a continuum of predetermined design levels. The effects of stray capacitances and inductances caused by external components are also sufficiently present in analog modules which use lower frequencies, as in the front end of an AM tuner which includes the RF and mixer stages, to cause faulty functional or diagnostic test results.

A typical prior art system in use at the time of this invention has a probe fixture commonly known as the "bed of nails" having a plurality of fixed probes to each of which is connected an electrical lead coupling to test equipment. A printed circuit board is fixed to a diaphram and placed over and aligned with the probe fixture, but spaced therefrom forming an air chamber between the fixture and the board. When it is desired to contact the probes against the board, the air chamber is evacuated, drawing the board into contact with the bed nails. As mentioned above, it is also known to have the panel fixedly mounted and to move the whole "bed of nails" or selected groups of "nails" into contact with the circuit board. Such systems are plagued with the shortcomings discussed above.

SUMMARY OF THE INVENTION

Accordingly the objects of the present invention are to provide:

A single probe fixture for selectively connecting a circuit board or panel to manual or automatic test equipment which is capable of use for all static and dynamic functional and diagnostic testing of sections or components on the board or panel and which provides highly accurate test results.

A new method for interconnecting the unit under test to the stimulus and measurement equipment. Typically, the novel method uses pneumatic or hydraulic force to actuate individual probes in response to a predetermined programmed control.

A system employing program control of individual probes for making and breaking contact with the test panel.

A probe fixture having the characteristics of durability, excellent shielding from external noise, application over a wide range of frequencies from audio to about 200 megahertz, and low and essentially constant contact resistance for all levels of expected operating currents.

A universal test fixture comprising a signle programmable probe fixture having a plurality of independently addressable probes having application to all printed circuit boards or similar circuit panels.

A universal test fixture that is easy to load, simple to operate and adaptable to a variety of probe designs.

An improved programmable probe adapted for housing an electronic circuit for performing a variety of functions, such as, a buffer amplifier or a detector circuit.

Briefly, the invention in its preferred form is a programmable probe fixture for connecting a unit under test and an electrical interface which includes a support means having a plurality of guide means, a plurality of probes, each probe being mounted in connection with one of the guide means for movement in a predetermined plane, each probe independently movable between a first and a second position, means for selectively moving each probe from the first to the second position and for returning each probe from the second to the first position in response to the predetermined program, and conductive means mounted on each probe forming a continuous conductive path between the unit under test and the electrical interface when the probe is in the second position.

Another aspect of the invention is the use of fluid pressure piston and cylinder drive means for independently actuating selected cylinders and forming the continuous conductive path through the piston and cylinder.

DETAILED DESCRIPTION OF THE PREFERRED EMBODIMENTS

The foregoing and other aspects of the present invention will be understood more fully from the following detailed description of an illustrative embodiment of the present invention in conjunction with the accompanying drawings in which, in the interest of clarity, the same number is used in numerous drawings to refer to the same or similar parts.

Figures 1, 2, 2A, 3:
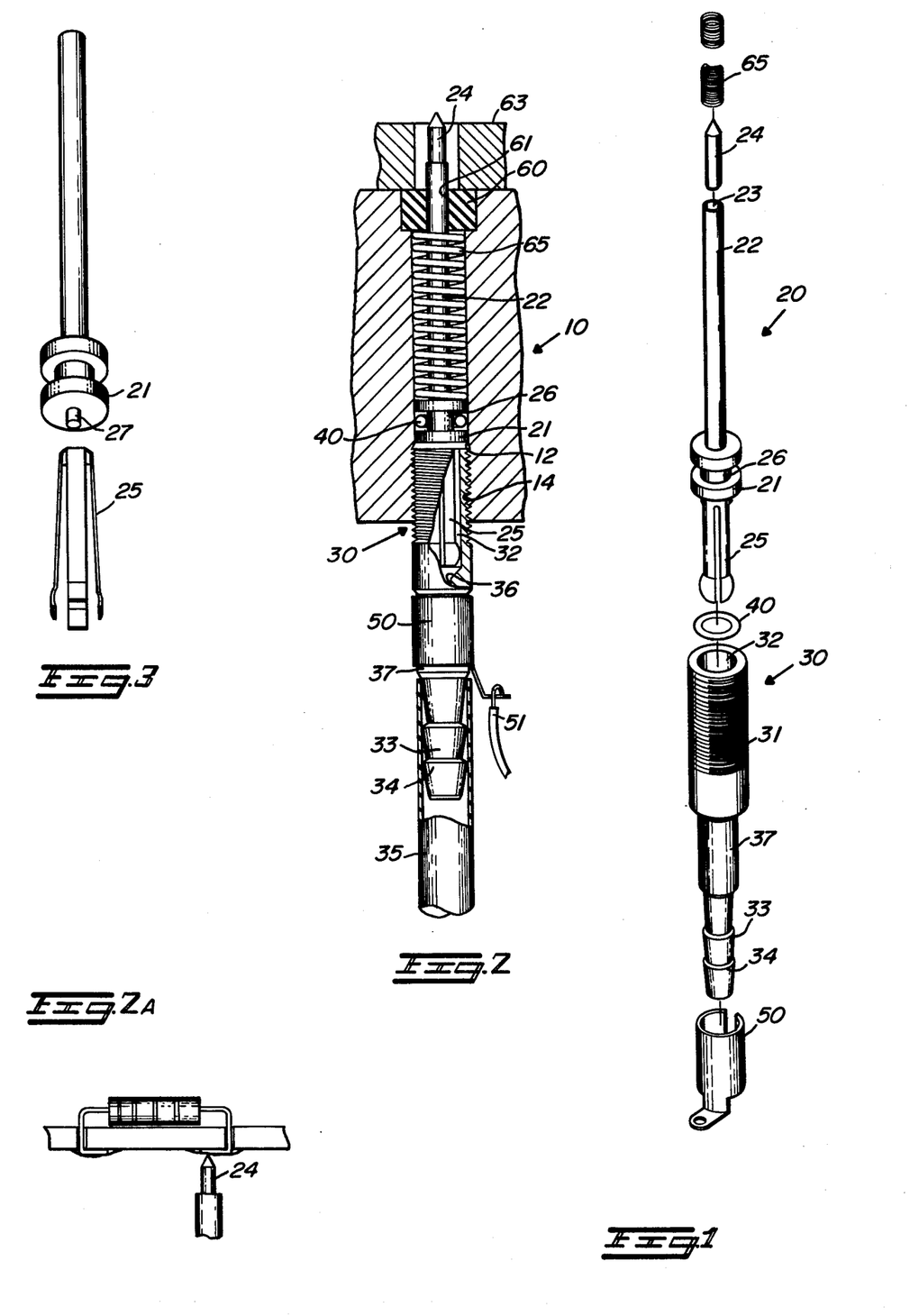
FIG. 1 is an exploded perspective of a DC probe made according to the invention.
FIG. 2 is a vertical elevation is partial section of the probe shown in FIG. 1 with the probe in the retracted position.
FIG. 2A is a vertical elevation in partial section showing the probe of the present invention being brought into contact with a printed circuit board under test.
FIG. 3 is a vertical elevation of an alternative embodiment of the probe of FIG. 1.

FIGS. 1 and 2 show a DC probe of the present invention mounted in a support means 10 having an aperture 12 therethrough. While only a single aperture is shown in the support 10, it is understood that the support has a plurality of apertures with a single probe mounted within each aperture. The aperture 12 serves as a cylindrical opening and a guide means within which the probe is reciprocated as more fully described below. The probe is supported in connection with the aperture 12 by being mounted therein for movement in a predetermined plane in alignment with a terminal on the printed circuit board under test as shown in FIG. 2A. In the embodiment of FIGS. 1 and 2, the support 10 is made of a non-conductive material. However, in other embodiments the support may be made of a conductive material. The aperture 12 at its lower end has a portion of widened diameter 14 which is threaded.

The unit under test, as shown in FIG. 2A, may be a typical printed circuit board or panel well known in the art. For example, panels ranging in size from 1¾ × 2¼ inches to 4 × 8 inches are well known in the field and may be used. However, the present invention, employing independently actuatable probes, may be used with any size panel by simply mounting the panel adjacent the support 10 where it may be contacted by the probes, when extended and then providing as many openings 12 and probes 20 as are necessary to provide all the test capability which it is desired to build into the probe fixture and related test equipment. Accordingly, the probe fixture of the present invention is truly a universal test fixture.

The probe 20, shown in FIG. 1, includes a piston means 21 having an enlarged diameter reciprocably mounted within the cylinder 12 closing one end thereof. Piston means 21 includes an elongated stem portion 22 of conductive material having a recessed opening 23 at one end thereof. Received within the opening 23 and frictionally held therein is a tip 24. The tip may be held within opening 23 by any known means or may be an integral portion of the stem 22. The piston means 21 further includes an integral depending contact member 25 made of conductive material extending below the enlarged diameter piston portion 21 and having a collet design comprising a plurality of depending fingers which are biased outwardly slightly for contacting the interior of the end closure member 30, as more fully described below.

The other end of the cylinder 12 below the enlarged piston 21 is closed by a closure fitting 30 fitted within the enlarged aperture portion 14 of the cylinder. Closure fitting 30 may be mounted in connection with the cylinder by any known means as by threads 31. Fitting 30 has a central bore 32 therethrough and is adapted, such as by reduced diameter portion 33 carrying ridges 34, for receiving hose 35 for permitting the ingress and egress of fluid under pressure. Closure fitting 30 is made of a conductive material and, when mounted in support 10, slideably receives fingers 25 within its central bore 32 forming a complete electrical path between the movable piston means 20 and the closure 30.

The walls of the cylinder 12 beneath the enlarged piston portion 21, the piston 21, and the closure fitting 30 including its central bore 32 define an expandable chamber which comprises a means for selectively moving each probe from a first retracted position to a second extended position in response to a first predetermined pressure in the chamber and for returning each probe in the other direction from the extended position to the retracted position in response to a second predetermined pressure in the chamber, all in accordance with a predetermined program, as more fully described below, which directs which of the probes are to be moved and at what time. Of course, with each probe having its own moving means as aforesaid, each probe is therefore independently movable relative to the other probes between the positions described. In this preferred embodiment, the fluid pressure drive means is air.

The chamber is provided with sealing means which include O-ring 40 mounted on a reduced diameter portion 26 of piston means 21. The other end of the chamber is sealed by the closure fitting 30 except for the passage 36 which comprises the means for introducing the fluid under pressure into the chamber.

The elongated stem 22, the tip 24 and the depending fingers 25 comprise a first conductive means mounted on the piston means 21 and movable therewith into contact with the unit under test when the piston is in the second or extended position (FIG. 2A) and movable out of contact with the unit under test when the piston is in the first or retracted position (FIG. 2). The closure fitting 30 comprises a second conductive means electrically coupled to the first conductive means forming therewith a continuous conductive path through the piston and cylinder providing a conduit for the passage of electrical signals. Closure fitting 30 is adapted for connection with the electrical interface through means of lead 51 and contact clip 50 which is a conductive member frictionally mounted on the exterior cylindrical portion 37 of fitting 30, whereby signals are transmittable between the unit under test and the electrical interface when the piston is in the second position. Each probe 20 has its associated lead 28 connecting to the electrical interface. At the electrical interface, connection is made to electronic stimulus equipment for providing signals to the unit under test through the selected probe or to electronic measuring equipment for evaluating signals received from the unit under test through the selected probe.

Piston means 21 is further guided by bushing 60 having a central bore 61 slideably receiving the extended stem portion 22 of the piston. The bushing is held fixedly within the cylinder 12 by closure 63 secured to support 10 by screws 64 (See FIG. 4). Both bushing 60 and cover 63 may be made of non-conductive material.

Means for biasing the piston from the extended position to the retracted position is provided by spring 65 concentrically mounted over stem 22 with one end abutting bushing 60 and the other end abutting the top of piston 21.

When the piston is moved from the first to the second extended position, stem 22 and tip 24 extend beyond the ends of support 10 and cover 63 for contacting the unit under test. In this position movement of the piston is limited by bushing 60 against which spring 65 is compressed. When the piston is retracted under the action of spring 25 to the first position it is substantially withdrawn within support 10 to the point where its motion is limited by piston 21 abutting closure 30.

Contact between tip 24 and the prealigned junction of the unit under test when the piston is in the extended position is shown in FIG. 2A.

In FIG. 3 an alternative construction of the probe is shown wherein the depending portion 25 is stamped from a cross-shaped metal member separate from the piston means but attached thereto by bending over lug 27 so that member 25 is integral with the piston means 21. In this embodiment the metal member 25 is also formed with a plurality of depending flange portions biased outwardly from the central axis into contact with the central bore 32 of closure fitting 30.

As thus described, the probe of FIGS. 1-3 is a programmable probe which has particular utility for transmitting low frequency signals such as DC signals between the electrical interface and the unit under test. Since the only probes which are moved up into contact with the unit under test are the probes that are required for that test alone, be it a static, dynamic, functional or diagnostic test, the probe fixture of the present invention always uses a minimum number of probes and, with the shielding as described below, the stray capacitances and inductances parasitically coupled to the unit under test as a result of the frequency characteristics of the probes themselves is de minimus. Thus the signals sent to or received from the unit under test may be highly accurate and truly representative of the designed or operating characteristics of the circuit under test.

Figures 4, 5, 6, 7:
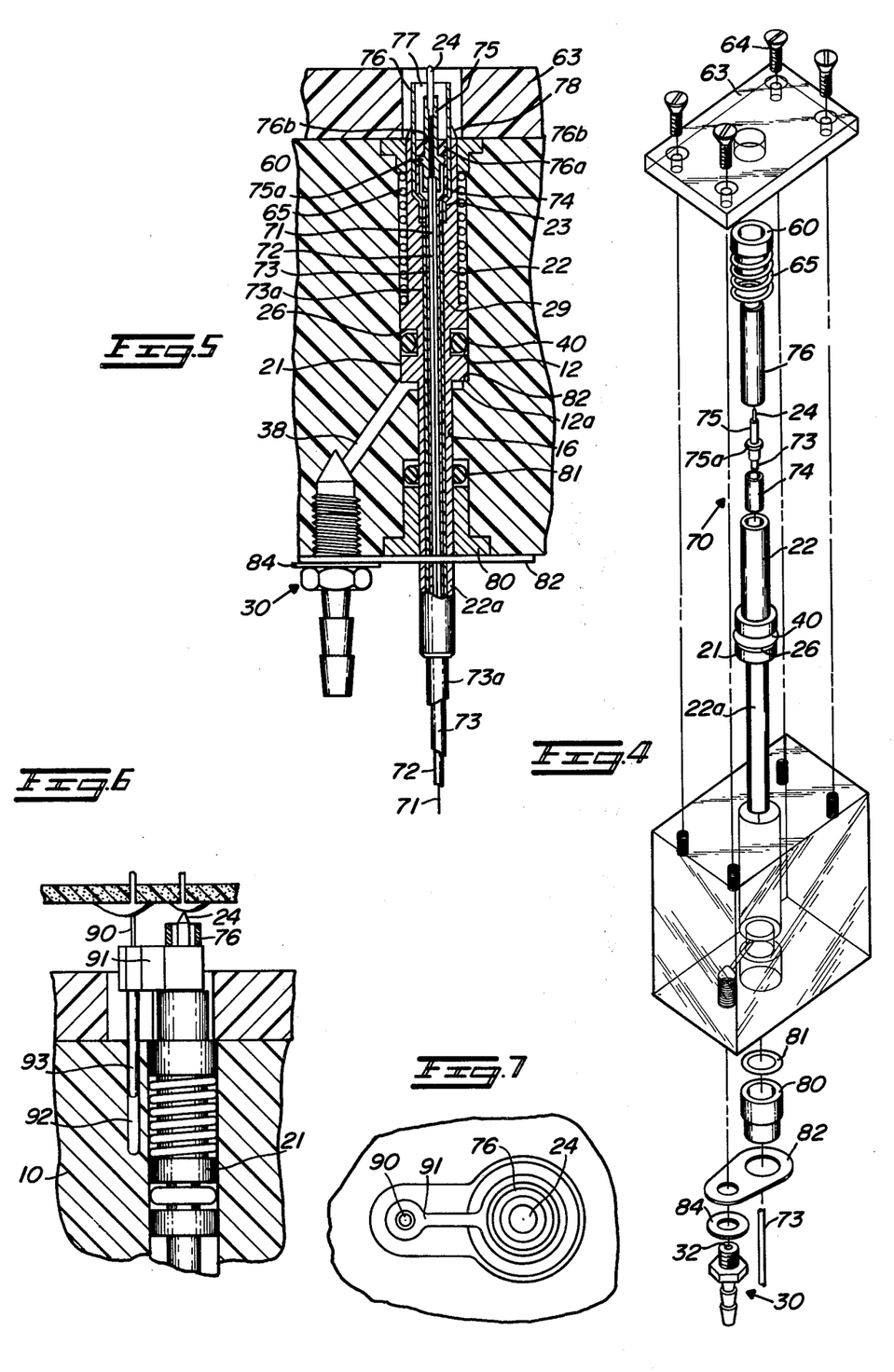
FIG. 4 is an exploded perspective of a high frequency probe made according to the present invention.
FIG. 5 is a vertical elevation in partial section of the probe shown in FIG. 4 with the probe in the retracted position.
FIG. 6 is a vertical elevation in partial section showing the probe in FIG. 5 in the extended position including a ground probe connected therewith.
FIG. 7 is a plan view of the probe of FIG. 6.

Referring now to FIGS. 4 through 7 there is shown a preferred embodiment providing a high frequency probe. In this version, as shown in FIGS. 4 and 5, the piston means 21 includes the first elongated stem portion 22 extending above the enlarged diameter of the piston 21 and a second stem portion 22a extending below the enlarged piston portion 21. A central bore 29 extends through the entire piston and both extended stem portions and has an enlarged recessed opening 23 at the upper end. The cylinder 12 has an aperture 16 of reduced diameter which slideably receives the second stem porton 22a for guiding the movement of the piston.

Mounted coaxially in the central bore 29 of the piston means is a shielded cable assembly 70. The assembly comprises a central conductor 71, a layer of insulative material 72 surrounding the central conductor 71, a conductive shielding material 73 surrounding the insulative material 72 and an insulative covering 73a surrounding the shielding material 73. A conductive ground bushing 74 surrounds the upper end of shielding material 73 from which the insulative covering 73a has been peeled off for coupling to the interior wall of outer shell 76 which is also made of a conductive material. Formed interiorly of the outer shell 76 and affixed thereto is an insulative bushing 76a having a central bore 76b for receiving inner tip housing 75 having annular flange 75a in abutting relation with bushing 76a and electrically isolated from conductive members 73, 74, 76. The upper end of central conductor 71 is led through the central bore of inner tip housing 24a and is crimped over the upper end thereof. Tip 24 is affixed to the tip housing 24a in contacting relation with central conductor 71. Alternate known means may also be used in connecting conductor 71 to housing 24a, and tip 24 may be made integral with housing 24a. Once assembled, the shielded cable assembly 70 is crimped laterally in the area adjacent the ground bushing 74 and then the end around tip 24 is filled with epoxy 77. The entire assembly 70 is then fixedly mounted within the recessed opening 23 of the piston 21. The cylindrical member 76 and the entire cable assembly may be further secured to the piston 21 by soldering 78 when the piston means 21 and stem 22 are of a metal material. A portion of tip 24 is left exposed beyond the cylinder shell 76 for contacting the unit under test as shown in FIGS. 5 and 6. Thus, in this embodiment, the shielded cable assembly 70 provides in a single unit, what piston means 21 and closure member 30 provided in the embodiments of FIGS. 1 to 3, namely, a first 24, 24a and second 71 conductive means, here conjoined, to form a continuous conductive path between the unit under test and the electrical interface when the probe is extended into the second position. The cable assembly 70 provides a third conductive means 73, 74, 76 for grounding stray signals or for coupling to a ground terminal on the panel under test as shown in FIG. 6 and described infra. Other known shielded coaxial cable assemblies can be manufactured using the aforesaid principles. Such assemblies are available in the trade. One such coaxial connector is available for the Malco Co., Lepra-Con Connector Part No. 142-1000-0001.

As in the first embodiment, bushing 60 functions to slideably receive stem portion 22 for guiding the piston movement in a predetermined plane.

The fluid pressure chamber in the embodiment shown in FIG. 5 is again defined by the cylinder walls 12, the underside of piston 21, the surfaces of reduced diameter stem portion 22a, the top surface 12a adjacent the reduced diameter portion 16 of the cylinder and, as well, closure fitting 30 and passage 38 which connects the passage 36 and central bore 32 of closure fitting 30 with the cylinder 12 for the ingress and egress of the fluid under pressure. To ensure that no fluid leaks out around the reduced diameter portion 22, that portion of the cylinder is closed by a second closure fitting 80 mounted concentric with the stem 22a which pushes the sealing O-ring 81 into sealing relation against stem 22a. Fitting 80 is held in place by end plate 82 mounted against support 10 by washer 84 and end fitting 30. The other end of the cylinder of course is sealed by O-ring 40 mounted on neck 26 of piston 21. Bias is again provided by spring 65 as in the embodiment of FIGS. 1 to 3. Other biasing means may also be used.

In this embodiment, the piston 21 may be made of a non conductive material as the coaxial cable assembly 70 is completely insulated and shielded. In the FIGS. 4-5 version, the preferred fluid used for driving the piston means is air, but hydraulic fluid and other known drive means may also be used.

Piston motion is limited in the up position by bushing 60 and spring 65 and in the lower position by a shoulder 82.

As thus described, the embodiment of FIGS. 4 and 5 provides a programmable probe for transmitting high frequency signals in the megacycle range. The shielding provides excellent isolation from external noise.

Referring now to FIG. 6 there is shown in the extended position the probe of FIG. 5 modified to include a ground probe 90 and a mounting clip 91 which secures the ground probe to the conductive cylindrical outer shell 76 which is coupled to the shielding material 73 of the coaxial cable through the conductive ground bushing 74. The ground probe 90 reciprocates with the shielded cable assembly 70 in order to provide a ground probe connection with the printed circuit board under test immediately adjacent the terminal contacted by the tip 24 for use with very high frequencies. As is known in the art, it is important to provide impedance matching when transmitting high frequencies between the unit under test and the test equipment. The arrangement of the probe of FIG. 5 has such a characteristic impedance between the tip 24 and the shielding material 73, 74, 76 by connecting the latter to ground through an external lead (not shown). This characteristic impedance is predetermined at approximately 50 ohms. Such an arrangement is satisfactory for most high frequency uses. However, for ultra-high frequencies it is important to ground the shielding material at a point immediately adjacent the tip 24 to assure that the characteristic 50 ohm impedance is carried through to the printed circuit under test. The arrangement of FIG. 6 does this. Alignment of probe 90 is maintained when piston 21 is reciprocated by modifying support 10 to include an aperture 92 and a guide post 93 mounted to connector 91 and slideably received within aperture 92 for guided movement therein.

Figure 8:
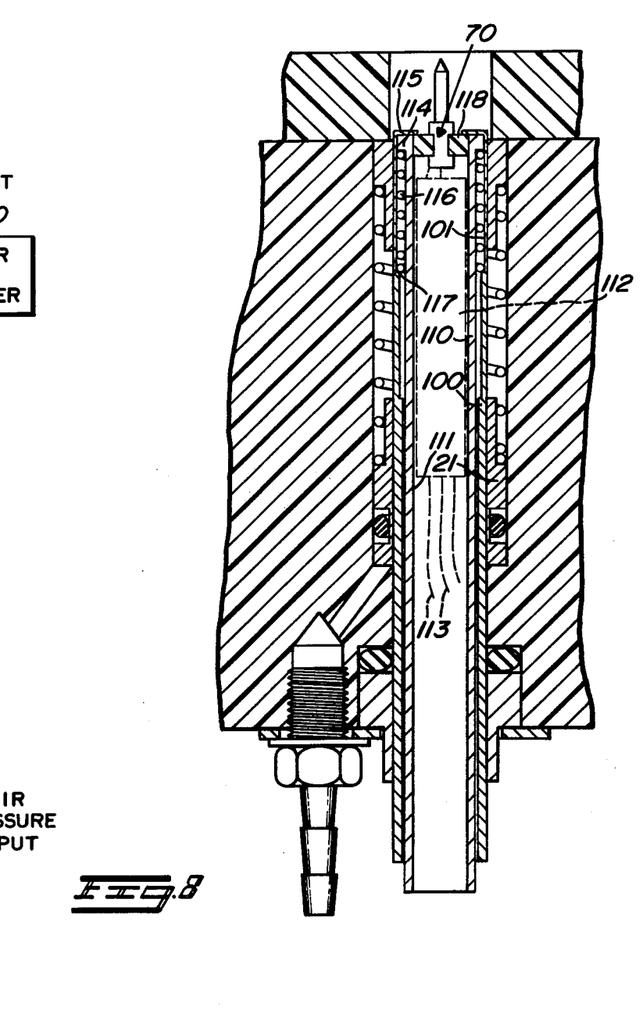
FIG. 8 is a vertical elevation in partial section of a further embodiment of the present invention including an electronic circuit board housed within the probe.

FIG. 8 shows a still further embodiment of a programmable probe fixture made in accordance with the present invention. Again, identical reference numbers are repeated as they apply to the same or similar structures previously described. In the embodiment of FIG. 8, the first stem portion 22 and second stem portion 22a described in FIG. 5, are formed as an outer hollow cylindrical housing 100 frictionally mounted to the piston 21 so that it is movable therewith. Housing 100 has a recessed end 101. Received within cylinder 100 is an inner cylindrical housing 110 which has a central bore 111 therethrough in which the shielded cable assembly 70 is fixedly mounted by end plug 118 having a portion of tip 24 extending beyond the end of the inner cylinder 111 for contacting the unit under test. The shielded cable assembly 70 includes an electronic circuit board 112 on a substrate connecting the tip 24 at one terminal end and having wires 113 extending from the other terminal end connecting to the electrical interface. Inner housing 100 is received within the recessed end 101 of the outer housing 100 and is provided with shoulder means 114. Assembly 70 is held within housing 100 by any known means such as by bending over flange 115 of housing 110. Biasing means 116 is interposed between the shoulder 117 of outer cylindrical housing 100 and shoulder 114 of inner cylindrical housing 110. Accordingly, housing 110 is movable within definable limits within housing 100. The reason for this feature is obviously to provide a means for softening the impact of point 24 when it contacts the aligned terminal of the panel under test in order not to damage the sensitive electronic circuit 112 due to the impact shock. When the piston is moved to the second position in contact with the unit under test, the shielded assembly and inner housing is moved inwardly slightly relative to the outer housing against the action of the biasing means and when the piston is moved to the first position, the biasing means restores the inner housing against end flange 115. The construction as described provides wide flexibility for fixing in probe 20 a wide variety of electronic circuits capable of performing numerous functions in association with the unit under test and the test equipment through the electrical interface. Circuit 112 may house buffer circuits or detector means as one example.

Figure 9:
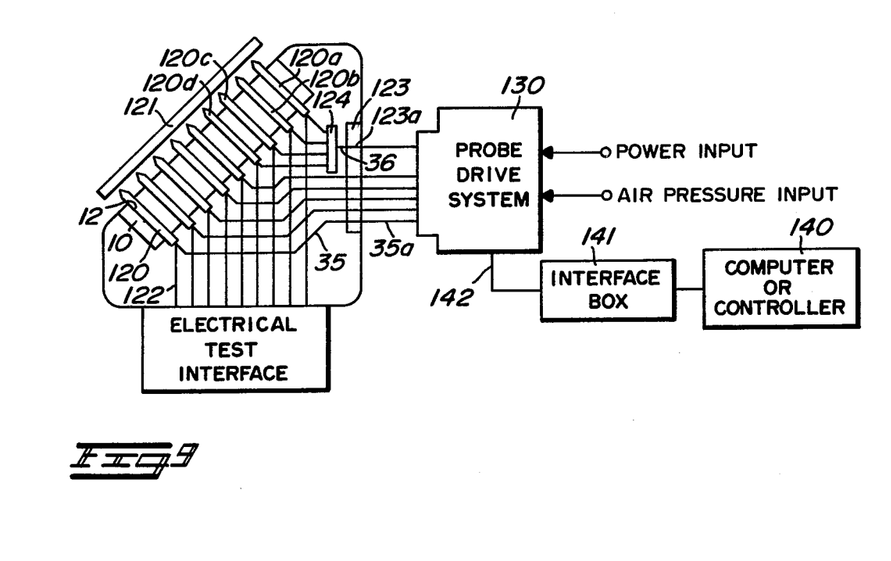
FIG. 9 is a block diagram showing the independently actuatable probes of the present invention as part of a complete system using the probes to interconnect the panel under test with an electrical test interface.

In FIG. 9 there is shown a programmable probe fixture system according to the present invention. Support 10 houses the plurality of guide means 12 and a plurality of probes 120, one probe supported in connection with each guide means for movement in the predetermined plane from the first retracted position to the second extended position in contact with the unit under test 121. Each probe has a wire 122 coupling the conductive means in the probe to the electrical interface. Each probe has a hose 35 coupling the closure fitting to one end of an individual passage 123a in a junction block 123. Selected ones of the probes 120a, 120b, 120c and 120d may have their hoses 35 connected to a common air manifold 124. Manifold 124 is coupled to an individual passage 123a in junction block 123 by hose 36. The other end of each individual passage 123a in junction block 123 is connected to a hose 35a of the probe drive system 130. A probe drive means or system 130 is provided for individually operating the probe moving means of each probe 120 in the probe fixture or for collectively operating the individual probe moving means of probes 120a, 120b, 120c and 120d in response to command signals received from a controller means 140.

Controller means 140 provides command output signals corresponding to a predetermined program, which signals are coupled to the probe drive means 130 through interface box 141 and electrical drive lines 142, only one such line being shown for simplicity. Controller 140 may be a computer or other programmable control means as is known in the art.

Probe drive system 130 is, in the preferred embodiment, a fluid drive means such as an air drive system having power and air pressure inputs and a plurality of output passages, each passage being coupled to a hose 35a and means for controlling the fluid pressure at each output passage in response to the command signals from the controller means 140.

Figure 10:
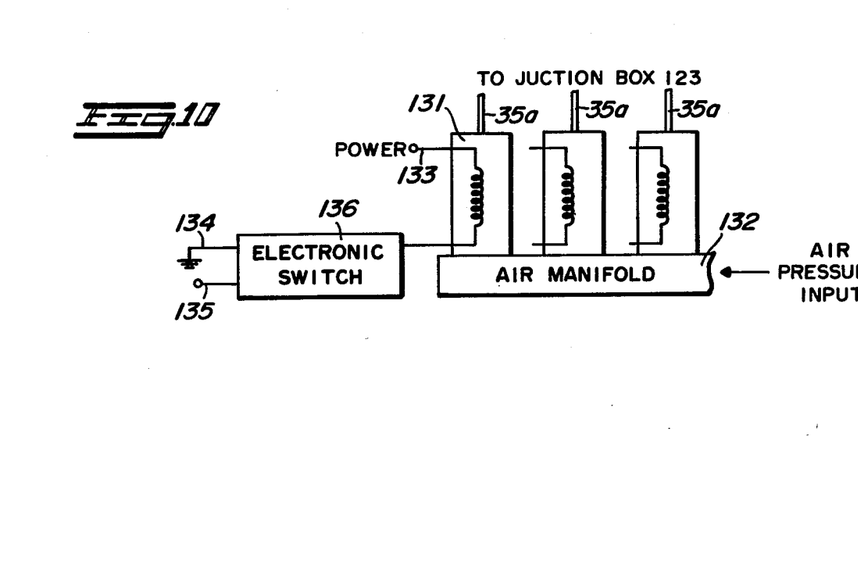
FIG. 10 is a circuit diagram showing the control circuit for operating the probe drive system of FIG. 9.

The particular means for controlling the fluid pressure at each output passage of probe drive system 130 is shown in FIG. 10 and includes a solenoid operated valve 131 between the air manifold 132 and the hose 35a connecting to each probe cylinder through a passage 123a in junction box 123. Solenoid valve 131 is movable (not shown) between a first position opening the output passage to admit fluid under pressure to the selected cylinder of the probe through hose 35a and a second position closing the output passage and venting (not shown) to atmosphere the fluid pressure in the hose 35a from the cylinder. One output terminal of the solenoid is connected to a DC power source 133 and the other output signal is connected to ground 134 through an electronic switch 136 operable to a first position completing the solenoid circuit to ground in response to a signal received at a control terminal 135 and operable to a second position interrupting the electrical circuit to the solenoid in the absence of a command signal at the control terminal 135. Control terminal 135 is in each instance connected to the control means 140 through a line 142 and interface box 141 and receives the command signals from control means 140 which programs which of the probes is to move and at what time. When a command signal admits air to the hose 35a which is connected to air manifold 124 through hose 36 and passage 123a, all probes 120a, 120b, 120c and 120d are simultaneously collectively operated. In this manner, certain types of tests which always require the same multiple number of selected probes can be collectively operated with a single command signal from the preprogrammed control means 140.

In operation, the programmable probe fixture of the present invention connects the unit under test to the electrical interface according to the following process steps: a plurality of probes 120 are supported for guided movement in connection with cylinder 12 of support base 10. Each probe is then selectively driven independently of the other probes from a first retracted position to a second extended position by affixing the probe to a reciprocable piston 21 mounted in the cylinder 12 and reciprocating the piston in response to predetermined fluid pressures in the cylinder corresponding to command signals received in accordance with a predetermined program from the controller 140. The command signals control a pneumatic drive system 130 which admits air under pressure to the selected cylinder in response to the command output signal. When the piston is in the second position, the conductive probe 24 is contacted against the unit under test. This is accomplished by mounting the unit under test adjacent the probes and extending the probe portion 24 beyond the cylinder 12. The probe is then electrically coupled to the electrical interface through wires 122 such that electrical signals are transmittable between the unit test and the electrical interface since a continuous conductive path is formed between the unit under test and the electrical interface through conductive means in the piston and cylinder and through wire 122. To eliminate the possibility of picking up stray noises when operating at high frequencies, the conductive means is insulated and shielded from the piston and cylinder.

In one version of the invention, when the piston is in the second position in contact with a prealigned terminal of the panel under test, a ground probe 91 is simultaneously contacted against a grounded connection on the panel to assure that the predetermined characteristic impedance of the probe is directly coupled to the panel under test.

For certain tests, some probes 120a, 120b, 120c and 120d may be simultaneously but independently driven by a single command signal by coupling the moving means of those probes to a common manifold 124.

Finally, each probe is retracted from the second position to the first position in response to a lower predetermined pressure in the cylinder. The return action may be also accomplished by biasing spring 65 while simultaneously venting the fluid in the cylinder to atmosphere or by otherwise subjecting the piston to a net force in the direction away from the unit under test. In another version of the invention, seen in FIG. 8, a circuit board in housed on a substrate within the probe assembly and forms a part of the conductive path between the panel and the electrical interface.

What has been described above is a preferred embodiment of the programmable probe of the present invention particularly adapted for connecting a unit under test to stimulus or measurement equipment for transmitting therebetween electronic signals. Other uses may be made of the invention, for example, temperature sensing. Various other modifications and changes may be made to the present invention from the principles of the invention described above without departing from the spirit and scope thereof, as encompassed in the accompanying claims.

We claim:

1. A connecting device for transmitting signals between a unit under test and an electrical interface comprising cylinder means, piston means reciprocably mounted within the cylinder closing one end of the cylinder, means closing the other end of the cylinder, the cylinder means, piston means and closing means defining an expandable chamber, means for sealing the chamber,
means for introducing a fluid at a predetermined pressure into the chamber,
the piston means being movable in one direction to a first position in response to a first predetermined pressure in the chamber and in the other direction to a second position in response to a second predetermined pressure in the chamber,
means for limiting the axial movement of the piston means,
first conductive means mounted on the piston means and movable therewith into contact with the unit under test when the piston is in the second position and out of contact with the unit under test when the piston is in the first position,
second conductive means electrically coupled to the first conductive means forming therewith a continuous conductive path providing a conduit for the passage of electrical signals, the second conductive means adaptable for connection with the electrical interface, and
a first stem portion of reduced diameter depending from the piston means into the expandable chamber slidably received by the closing means for guided movement in the expandable chamber
whereby signals are transmittable between the unit under test and the electrical interface when the piston is in the second position.

2. A connecting device for transmitting signals between a unit under test and an electrical interface comprising
cylinder means,
piston means reciprocably mounted within the cylinder closing one end of the cylinder,
means closing the other end of the cylinder,
the cylinder means, piston means and closing means defining an expandable chamber,
means for sealing the chamber,
means for introducing a fluid at a predetermined pressure into the chamber,
the piston means being movable in one direction to a first position in response to a first predetermined pressure in the chamber and in the other direction to a second position in response to a second predetermined pressure in the chamber,
means for limiting the axial movement of the piston means,
first conductive means mounted on the piston means and movable therewith into contact with the unit under test when the piston is in the second position and out of contact with the unit under test when the piston is in the first position,
second conductive means electrically coupled to the first conductive means forming therewith a continuous conductive path providing a conduit for the passage of electrical signals, the second conductive means adaptable for connecting with the electrical interface whereby signals are transmittable between the unit under test and the electrical interface when the piston is in the second position,
wherein, the piston means has first and second stem portions of reduced diameter affixed thereto and extending axially therefrom,
guide means in the cylinder slidably receiving the stem portions for guiding the movement of the piston,
wherein the guide means includes a bushing mounted in the cylinder means above the piston means having a central bore therethrough slidably receiving one of the stem portions of the piston means and an aperture of reduced diameter portion below the piston means slidably receiving the other of the stem portions of the piston means,
means securing the bushing within the cylinder means, and
the conductive means extending beyond the cylinder means when the piston is in the second position for contacting the unit under test and being substantially retracted within the cylinder and securing means when the piston is in the first position.

3. The connecting device as claimed in claim 2 further comprising
biasing means for biasing the piston means from the second to the first position.

4. The connecting device as claimed in claim 3 wherein the biasing means is a spring mounted concentrically over the first stem portion between the piston means and the bushing for biasing the piston means from the second position to the first position.

5. The connecting device as claimed in claim 2 further comprising a shoulder formed in the guide means and wherein the limiting means includes the bushing when the piston is in the second position and the shoulder means when the piston is in the first position.

6. The connecting device as claimed in claim 2 wherein
the means closing the other end of the chamber includes
a first closure fitting concentrically mounted over one of the stem portions of the piston means and the second conductive means, and
the means for sealing the chamber includes a first sealing means mounted on the piston.

7. The connecting device as claimed in claim 6 wherein,
the means closing the other end of the chamber includes a second closure fitting mounted in connection with the cylinder means having a central bore therethrough, a passage in the cylinder means connecting the central bore of the second closure fitting to the chamber for the ingress and egress of the fluid under pressure, and
the means sealing the chamber includes a second sealing means mounted between the first closure fitting and the guide means.

8. The connecting device as claimed in claim 1 wherein the first stem portion has a portion of widened diameter at its lower end spaced from the piston means, said widened diameter portion of said first stem portion guidingly contacting said closing means in said expandable chamber.

9. The connecting device as claimed in claim 1 wherein said means closing the other end of the expandable chamber means comprises an aperture which provides a passage for the fluid under pressure into the chamber.

10. The connecting device as claimed in claim 8 wherein the closing means and the first stem portion are electrically conductive members in sliding electrical contact, and the cylinder means is made of non-conductive material and guidingly contacts said piston means.

11. The connecting device as claimed in claim 1 wherein the piston means is made of an electrically conductive material, the first conductive means includes an elongated second stem of conductive material affixed to the piston, the closing means is a conductive closure fitting having a central bore therethrough forming part of said expandable chamber, the first stem of the piston means being received within the central bore of the closure fitting and in sliding electrical contact therewith, and the closure fitting and first stem forming portions of the conductive means.

12. The connecting device as claimed in claim 11 wherein the first stem has a plurality of depending elastic fingers biased outwardly into contact with the closure fitting.

13. The connecting device as claimed in claim 11 wherein the first stem is a stamped metal member having a plurality of depending flange portions connected to the piston means and biased outwardly into contact with the closure fitting bore.

14. A connecting device as claimed in claim 1 wherein the first conductive means includes the piston means and an elongated second stem portion of conductive material connected to the piston means and extending therefrom in a direction opposite to said first stem portion, and guide means having a central bore therethrough for guidingly receiving said second stem portion.

15. The connecting device as claimed in claim 1 further comprising means for limiting the axial movement of the piston in the first and second positions and said limiting means in the first position including the closure fitting.

16. A fixture for programmable probes for transmitting signals between a unit under test and an electrical interface having support means, each probe of a number of probes being mounted on the support means for independent guided movement of individual probes between a first position and a second position, a fluid-pressure-operated expandable chamber for guiding and moving the probes between the first and second position, conductive means forming a continuous conductive path between the unit under test and the electrical interface for probes in the second position, the support means having guide means forming side wall portions of the expandable chamber means, and each probe having a piston slidingly received within the guide means and forming one end wall portion of the expandable chamber, wherein the improvement comprises, the probe having a first stem of reduced diameter depending from the piston into the expandable chamber and guidingly received by a portion of the support means, further comprising means closing the other end of the expandable chamber means, and the first stem of reduced diameter being slidingly received by the closing means while said closing means provides a passage for the fluid under pressure, wherein a second elongated stem is connected to the piston means, the first and second stems and piston means have a central bore therethrough, and the conductive means includes two separate circuits electrically isolated from each other and mounted within the central bore of the stem portions and piston means.

17. The connecting device as claimed in claim 14 wherein the means closing the other end of the chamber includes a first closure fitting concentrically mounted over the first stem, and the means for sealing the chamber includes a first sealing means mounted on the piston.

18. The fixture as claimed in claim 16, wherein the first and second stem portions include an outer hollow cylindrical housing affixed to the piston and reciprocable, the conductive means including an electronic circuit borad on a substrate, said board being mounted within the outer hollow cylinder, and shock absorbing means for the probes.

19. The fixture as claimed in claim 18, wherein the shock absorbing means comprises the outer hollow cylinder having a recessed end, an inner cylindrical housing having a central bore therethrough in which the conductive means is mounted, the conductive means having a portion extending beyond the outer cylinder for contacting the unit under test, the inner housing received within the recessed end of the outer cylinder and movable relative thereto, means for limiting the movement of the inner housing relative to the outer cylinder and for securing the cylinder and housing together, and spring means for biasing the inner housing outwardly relative to the outer cylinder whereby impact of the conductive means against the unit under test when the piston is moved to the second position causes a slight inward movement of the inner housing relative to the outer cylinder against the action of the biasing means.

20. The fixture as claimed in claim 16, wherein the piston means, first and second stem portions are made of a non-conductive material.

21. The fixture as claimed in claim 16 comprising one of the circuit means including a conductive tip, and a central connector coupled thereto mounted to the outer end of the second elongated stem and movable therewith into contact with the unit under test when the piston is in the second position, and the other of the circuit means including a shielding circuit around the conductive tip and the central conductor.

22. The fixture as claimed in claim 21, wherein the two circuit means includes a shielded cable assembly comprising a central conductor affixed to the conductive tip, a conductive shielding means surrounding the conductive tip and central conductor, and insulative means substantially surrounding the tip and the conductor and supporting the same within the shielding means in electrical isolation therefrom, means for securing the assembly within the central bore of the piston and first and second stem portions, a portion of the tip extending beyond the conductive shielding means and the insulative means.

23. The connecting device as claimed in claim 21, further comprising
the conductive means of one probe including a second probe, and means connecting the second probe to the shielding circuit means of the one probe for reciprocation therewith and adapted for contacting the unit under test, and
means for guiding the second probe,
the characteristic impedance between the first and second probes having a predetermined value.

24. The connecting device as claimed in claim 23, wherein the guide means for the second probe includes
the support means having an opening,
a post secured to the conductive connecting means and received in the opening for slidable guided movement therein.

25. A fixture for programmable probes for transmitting signals between a unit under test and an electrical interface having support means, each probe of a number of probes being mounted on the support means for independent guided movement of individual probes between a first position and a second position, a fluid-pressure-operated expandable chamber for guiding and moving the probes between the first and second position, conductive means forming a continuous conductive path between the unit under test and the electrical interface for probes in the second position, the support means having guide means forming side wall portions of the expandable chamber means, and each probe having a piston slidingly received within the guide means and forming one end wall portion of the expandable chamber wherein the improvement comprises the conductive means including two separate circuits electrically isolated from each other and mounted on the piston means.

26. The fixture as claimed in claim 25, wherein a second elongated stem is connected to the piston means, the first and second stems and piston means have a central bore therethrough, and the two separate circuits of the conductive means are mounted within the central bore of the stem portions and piston means.

27. The connecting device as claimed in claim 25, further comprising
the conductive means of one probe including a second probe, and means connecting the second probe to one of the circuit means of the one probe for reciprocation therewith and adapted for contacting the unit under test, and
the characteristic impedance between the first and second probes having a predetermined value.

28. The connecting device as claimed in claim 27, further comprising means for guiding the second probe.

29. The method of electrically connecting a unit under test to an electrical interface including the steps of:
supporting a probe for guided movement within a fluid pressure operated expandable chamber defined by cylinder means,
piston means reciprocably mounted within the cylinder means and closing one end of the cylinder means,
means closing the other end of the cylinder means, means for sealing the chamber, and
means for introducing a fluid at a predetermined pressure into the chamber, said piston means connected to the probe,
applying a first pressure to the chamber to drive the probe from a first retracted position toward a second extended position, while limiting the axial movement of said piston means,
contacting the probe against a first terminal of a unit under test,
electrically coupling the unit under test to the electrical interface for transmitting electrical signals therebetween, said step of electrically coupling being accomplished by first conductive means mounted on the piston means and movable therewith into contact with the unit under test when the piston is in the second position and out of contact with the unit under test when the piston is in the first position, and second conductive means electrically coupled to the first conductive means forming therewith a continuous conductive path providing a conduit for the passage of electrical signals to the electrical interface, and
retracting the probe by moving the probe to the first position in response to applying a second pressure to the chamber while limiting the axial movement of said piston means, wherein the improvement comprises the piston having a stem of reduced diameter depending therefrom into the expandable chamber and the step of guidingly receiving both the piston means and the reduced diameter portion in the expandable chamber during the extension step while slidably receiving the stem portion in the closing means for guided movement.

30. The method as claimed in claim 29, wherein the step of guidingly receiving the reduced diameter portion comprises
closing the other end of the expandable chamber with means including a conductive member having a central bore while providing a passage for the fluid under pressure,
slidingly contacting the reduced diameter portion within the central bore of the conductive closure member, and
coupling the signals through the probe, the piston stem and the conductive closure member to the electrical interface.

31. The method as claimed in claim 30, wherein the supporting step includes supporting the probe within a non-conductive chamber.

32. The method as claimed in claim 30, comprising applying the fluid pressure to operate the piston through the central bore of the conductive closure member.

33. The method of electrically connecting a unit under test to an electrical interface including the steps of:
supporting a probe for guided movement within a fluid pressure operated expandable chamber, one end of which is closed by piston means connected to the probe,
applying pressure to the chamber to drive the probe from a first retracted position toward a second extended position,
contacting the probe against a first terminal of a unit under test,
electrically coupling the unit under test to the electrical interface for transmitting electrical signals therebetween, and
retracting the probe by moving the probe to the first position wherein the improvement comprises the piston having a stem of reduced diameter depending therefrom into the expandable chamber and guidingly receiving the reduced diameter portion in the support means during the extension step
also comprising the steps of providing a central bore through the piston means, and, when the probe is in the second position, coupling electrical potentials through two separate circuit means electrically isolated from each other mounted in the central bore of the piston means.

34. The method as claimed in claim 33, comprising the steps of contacting one of the circuit means against the unit under test and coupling signals of one potential therethrough while coupling signals of a different potential through the other circuit means.

35. The method as claimed in claim 33, comprising the step of one circuit means being shielding means for the other circuit means and conducting stray signals through the shielding means.

36. The method as claimed in claim 33, comprising the step of resiliently supporting the two circuit means within the hollow piston for absorbing the impact shock of contacting the one circuit means against the unit under test.

37. The method as claimed in claim 33, comprising the steps of grounding the unit under test by contacting a conductive member coupled to the shielded circuit means against a second terminal of the unit under test.

38. The method as claimed in claim 37, further characterized by the step of:
  guiding the conductive member during the extension step.

39. The method of electrically connecting a unit under test to an electrical interface including the steps of
  supporting a probe for guided movement within a fluid pressure operated expandable chamber, one end of which is closed by piston means on the probe,
  applying pressure to the chamber to drive the probe from a first retracted position toward a second extended position,
  contacting the probe against a first terminal of a unit under test,
  electrically coupling the unit under test to the electrical interface for transmitting electrical signals therebetween, and
  retracting the probe by moving the probe to the first position wherein the improvement comprises the steps of providing a central bore through the piston means, and, when the probe is in the second position, coupling electrical potentials through two separate circuit means electrically isolated from each other mounted in the central bore of the piston means.

40. The method as claimed in claim 39, comprising the steps of grounding the unit under test by contacting a conductive member coupled to one of the circuit means against a second terminal of the unit under test.

41. The method as claimed in claim 40, further characterized by the step of
  guiding the conductive member during the extension step.

* * * * *